Feb. 20, 1968 F. F. OFFNER 3,370,242
TRANSISTOR AMPLIFIERS EMPLOYING FIELD EFFECT TRANSISTORS
Filed June 25, 1963
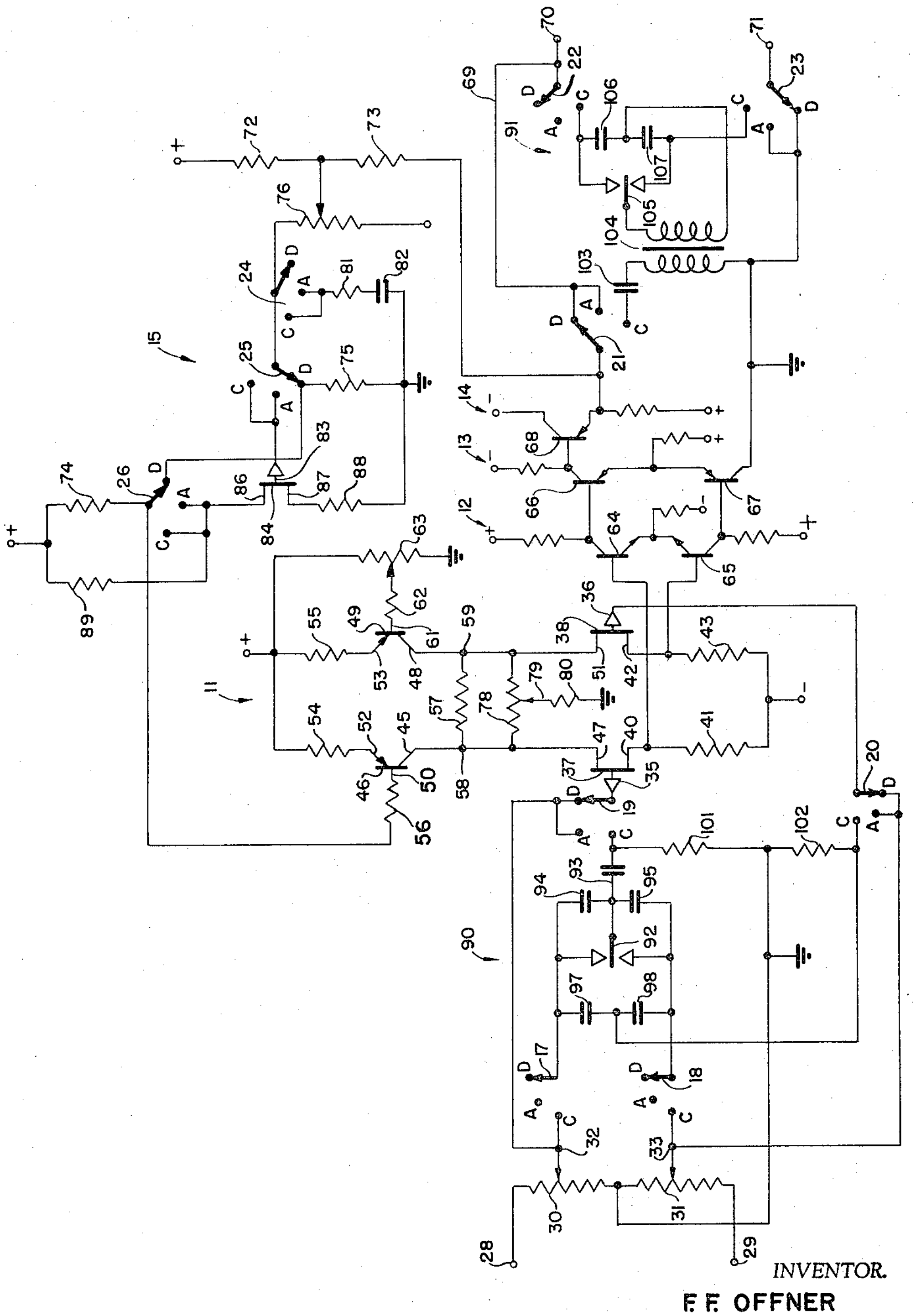
INVENTOR.
F. F. OFFNER
BY Paul L. Harder
ATTORNEY United States Patent Office 3,370,242

Patented Feb. 20, 1968

3,370,242

TRANSISTOR AMPLIFIERS EMPLOYING FIELD EFFECT TRANSISTORS

Franklin F. Offner, Deerfield, Ill., assignor to Beckman Instruments, Inc., a corporation of California Filed June 25, 1963, Ser. No. 290,413
13 Claims. (Cl. 330—9)

ABSTRACT OF THE DISCLOSURE

A transistorized common mode rejection type differential amplifier having a pair of current control means, one in series with the current amplifying terminal of each of two transistors of the differential amplifier and resistive means providing a current path between the current amplifying terminals of the two transistors.

This invention relates generally to electronic amplifiers and more particularly to an input stage employing field effect transistors for use in a differential amplifier. This invention further relates to a differential amplifier capable of high common mode signal rejection and selective operation as a direct coupled DC differential amplifier, a differential chopper amplifier and an AC differential amplifier having high DC suppression.

Chopper differential amplifiers may be advantageously employed when highest DC stability is required and when large common-mode DC or low-frequency DC signals are encountered. The chopper differential amplifier is, however, limited in that it will not pass high frequency signals. It is the general practice to employ input transformers with chopper differential amplifiers, which introduces various problems when utilized with high impedance sources. Further, in the past the conventional differential DC amplifier utilizing transistors have seriously limited the permissible source impedance since high source impedance causes loss of differential balance and decreased amplifier stability.

To provide an amplifier overcoming in large measure the problems above enumerated, the instant invention contemplates the utilization of a differential amplifier which may be selectively operated as a direct coupled DC differential amplifier, a differential amplifier with DC suppression and a differential chopper amplifier. When operating in the direct coupled differential mode the amplifier which is the subject of this invention provides relatively high DC stability, a high input impedance and good common mode signal rejection. Alternatively, the amplifier may be operated in the chopper mode when highest DC stability is desired.

It is therefore an object of this invention to provide a differential amplifier which may be selectively operated as a direct coupled DC differential amplifier, a differential amplifier with DC transmission suppressed, and a differential chopper amplifier.

Another object is the provision of a differential amplifier capable of selective operation as aforementioned while providing high rejection of common mode signals and a high input impedance.

Yet another object is the provision of a differential amplifier which may be selectively connected to amplify direct current components of input signals or alternatively to eliminate the direct current components from such signals. Still another object of the invention is the provision of a differential amplifier employing field effect transistors at the input stage which provides for the amplification of a differential signal applied to the input terminals of the amplifier, the amplifier having high input impedance and high rejection of common mode signals.

Yet another object of the invention is the provision of a differential amplifier having high input impedance and excellent common mode signal rejection which is compensated for fluctuations in ambient temperature without need for individual matching of the various transistors in the input stage.

A further object is the provision of an input stage for a differential amplifier employing field effect transistors, which stage provides high rejection of common mode signals and a high input impedance.

Other objects and many of the attendant advantages of this invention will become more readily apparent to those skilled in the art after consideration of the following specification when read in connection with the accompanying drawing.

The single figure of the drawing illustrates a general schematic circuit diagram of one exemplary preferred embodiment of the invention.

Referring now to the drawing in greater detail there is illustrated an amplifier incorporating the present invention and generally comprising a differentially connected first or input stage generally designated by the numeral 11, second and third differential stages 12 and 13 and an emitter-follower output stage 14 which provides a low output impedance. A feedback network 15 is connected between the output of the amplifier and the input stage 11.

As has been stated the amplifier may be operated as a direct coupled DC differential amplifier, a differential amplifier with DC transmission suppressed or a differential input chopper amplifier. Switches 17–26 provide a means for selecting the mode of operation of the amplifier. Each of the switches comprise an armature and three contacts designated A, C and D. The switches are simultaneously operated and in the D position as illustrated in the drawing the amplifier functions as a direct coupled DC differential amplifier. In position A the amplifier functions as a differential amplifier with DC transmission largely suppressed and in position C as a differential input chopper amplifier.

Terminals 28 and 29 constitute the input terminals of the amplifier and are connected through attenuators 30 and 31 to junctions 32 and 33. Attenuators 30 and 31 may, if desired, be omitted in which case the input terminals 28 and 29 would be connected directly to junctions 32 and 33. In an amplifier of a differential type it is desired to amplify the difference between the signals appearing at the input terminals without regard to the relative potential of these signals with respect to a point of reference potential, usually circuit ground. Thus, the amplifier amplifies the algebraic difference between the signal applied to terminal 28 relative to the signal applied to terminal 29 and must reject any signal common to each of these terminals. This common signal is generally referred to as a common mode signal.

When the amplifier is operated as a direct coupled DC differential amplifier, that is when switches 17–26 are in position D, junctions 32 and 33 are respectively directly connected to the gate electrodes 35 and 36 of field effect transistors 37 and 38 through respective switches 19 and 20. Drain electrode 40 of transistor 37 is connected through resistor 41 to a point of potential which is negative with respect to a reference potential such as circuit ground and drain electrode 42 is connected through resistor 43 to the source of negative potential.

Collector 45 of PNP transistor 46 is connected to source electrode 47 of field effect transistor 37 and collector 48 of PNP transistor 49 is connected to source electrode 51 of field effect transistor 38. Emitter 52 of transistor 46 and emitter 53 of transistor 49 are each connected through respective resistors 54 and 55 to a source of potential that is positive with respect to circuit ground. An impedance, such, for example, as resistor 57, is connected between the collectors of transistors 46 and 49 forming junctions 58 and 59. In the illustrated embodiment field effect transistors 37 and 38 are of the P-channel type, therefore transistors 46 and 49 are of the PNP type although it is apparent to those skilled in the art that N-channel type field effect transistors and NPN junction transistors may be utilized with the appropriate changes of potential.

Base 61 of transistor 49 is connected through resistor 62 to the slider (movable contact) of a potentiometer 63 connected between the source of positive potential and the reference potential, generally circuit ground. Base 50 of transistor 46 is connected through resistor 56 to the output terminal of the feedback network 15 described in greater detail hereinafter.

The output of the input stage 11 is taken from drain electrodes 40 and 42 of field effect transistors 37 and 38 and is fed to the bases of NPN transistors 64 and 65 connected as a long tailed pair and constituting the second stage of the amplifier circuit. The differential signal from the second stage 12 is applied to the bases of PNP transistors 66 and 67 also connected as a long tailed pair and constituting the third stage of the amplifier. The signal from the collector of transistor 66 is applied to the base of transistor 68 which constitutes the final or output stage of the amplifier and is connected as an emitter-follower in order to provide a low output impedance for the amplifier as is well known to those skilled in the art. The collector of transistor 67 is connected to the point of reference potential or circuit ground thus no signal is taken from this side of the differential stage 13. When the amplifier is being operated as a direct coupled DC differential amplifier, that is, when switches 17–26 are in the D position the emitter of the output stage 14 is directly connected through switch 21 and line 69 to output terminal 70 and output terminal 71 is connected directly through switch 23 to circuit ground.

A negative feedback signal is obtained from the emitter of output transistor 68. With each of the switches in the D position the feedback path of the amplifier comprises a first potential divider consisting of resistors 72 and 73 connected in electrical series circuit between a point of positive potential and the emitter of output stage 14 and a second potential divider consisting of resistors 74 and 75 connected in electrical series circuit through switch 26 between a point of positive potential and circuit ground. The movable contact of variable resistor 76 is connected to the junction of resistors 72 and 73. One side of resistor 76 is connected to the armatures of switches 24 and 25 while the other side of resistor 76 is unconnected. In the D position the armature of switch 24 is connected to a blank contact while the armature of switch 25 connects to the junction of resistors 74 and 75. Thus resistor 76 constitutes a variable impedance connected between the junction of resistors 72 and 73 and resistors 74 and 75 for the purposes of varying the attenuation in the feedback circuit thus providing an inverse variation in the gain of the amplifier as is more fully explained hereinafter.

In operation, the amplifier is initially balanced such that the desired DC output level at the emitter of transistor 68 exists with no input signal level. Generally, the amplifier is balanced such that zero volt appears across the output terminals with no input signal but any other DC output level may be chosen as desired. The desired DC output level of the amplifier is accomplished by adjustment of the potentiometer 63 which provides a constant bias at the base of transistor 49 to establish a quiescent current therethrough and through field effect transistor 38. Resistors 74 and 75 are proportioned so as to produce at the base of transistor 46 the DC voltage required to produce the desired DC output level at the emitter of transistor 68. Resistors 72 and 73 are so proportioned that the DC voltage at their junction is equal to the DC voltage existing at the junction between resistors 74 and 75 under quiescent conditions. Therefore, under quiescent conditions the same voltage exists at the movable contact of potentiometer 76 as exists at one end of the potentiometer, the other end being unconnected, thus changing the impedance of potentiometer 76 does not affect the DC level of operation of the amplifier but merely varies the attenuation in the feedback circuit.

Assume now that a symmetrical or differential signal with respect to circuit ground is applied to the input terminals 28 and 29. Further, assume that the potential at terminal 28 is positive with respect to the potential at terminal 29. The signal, depending upon the condition of attenuators 30 and 31 is attenuated and applied through switches 19 and 20, in the D position, to the respective gates of field effect transistors 37 and 38. The positive signal applied to gate electrode 35 of field effect transistor 37 is reflected at the source electrode 47 and the negative signal applied to the gate electrode 36 of field effect transistor 38 is reflected at the source electrode 51. If it be assumed that field effect transistors 37 and 38 each have very high transconductance then a small change in source to gate voltage will produce a large change in current through the source to the drain circuit. Also assuming very high transconductance the differential voltage appearing at the source electrode will be equal to the differential signal applied to gates 35 and 36. The differential voltage appearing at the source electrodes is applied across the impedance 57. In the practical case, however, the voltage developed across impedance 57 is slightly less than the differential input signal.

Since the base to emitter voltage of transistor 49 is controlled by the setting of potentiometer 63 and remains fixed the collector current is held quite firmly at the quiescent value. Initially, the emitter-base voltage of transistor 46 is also fixed by resistors 74 and 75, and thus the collector current of transistor 46 also remains at the quiescent value. Although the collector currents of transistors 46 and 49 initially remain constant, because of the presence of impedance 57, the current flow through field effect transistors 37 and 38 may change. In the example given where the voltage at gate 35 is positive with respect to the voltage at gate 36 a differential current flows through impedance 57 from junction 58 to junction 59. The current through the source-drain circuit of field effect transistor 37 thus decreases and the current through the source-drain circuit of field effect transistor 38 increases and a differential signal is developed across the respective drain resistors 41 and 43.

In the example, a negative going signal is therefore applied to the base of transistor 64 and a positive going signal is applied at the base of transistor 65. The input signal is amplified and inverted by the differential stage 12 and the output thereof is applied as the input to differential stage 13. Thus a positive going signal appears at the base of transistor 66 and a negative going signal appears at the base of transistor 67. Since the collector of transistor 67 in differential stage 13 is clamped firmly to the point of common potential or circuit ground a negative going signal appears at its emitter which is connected directly to the emitter of transistor 66. The positive going signal at the base of transistor 66 and the negative going signal at the emitter produce a negative going signal at the collector which is applied as the input to the emitter-follower stage 14. Thus the input to stage 14 is a signal representing the input differential signal to the amplifier even though the output of stage 13 is taken only from the collector of transistor 66. The output from emitter-follower stage 14 is taken from the emitter of transistor 68 and is applied through switch 21 in the D position to line 69 connected to the output terminal 70. Output terminal 71 is connected through switch 23 to the point of reference potential and the potential difference between terminals 70 and 71 is equal to the differential signal appearing at input terminals 28 and 29 times the gain of the amplifier.

The negative going signal at the emitter of transistor 68 increases the current flow through resistors 72 and 73 producing a negative going signal at the junction thereof. This negative going signal is applied through attenuator 76 to the base 50 of transistor 46 in the input stage of the amplifier. This negative going feedback signal increases the conduction of transistor 46 and therefore the current in the source-drain circuit of field effect transistor 37. The increased current through drain resistor 41 raises the potential at the base of transistor 46 until the differential signal applied to the second stage 12 is reduced to only that error signal required to sustain the output of the amplifier. It is now obvious that due to the proportioning of the voltage at each end of potentiometer 76 such that under quiescent conditions these voltages are equal and no current flows therethrough that changing the position of the slider (movable contact) does not affect the DC level of operation of the amplifier but merely varies the attenuation in the feedback circuit thereby providing an inverse gain control for the amplifier.

Assume now that a common mode signal is applied to the input terminals 28 and 29. In such a case the potential at each of terminals 28 and 29 either increases or decreases by an equal amount with respect to circuit ground.

For example, assume that a positive common mode signal is applied to both terminals 28 and 29. The potential at these input terminals is again respectively applied to the gate electrodes of field effect transistors 37 and 38. The potential of source electrode 47 increases and the potential of source electrode 51 also increases by an equal amount. Junctions 58 and 59 remain at the same relative potential and no differential voltage is developed across impedance 57. Since no potential change occurs across this impedance and since junction transistors 46 and 49 are initially acting as constant current sources for field effect transistors 37 and 38 the current flow in the source-drain circuit of each of these transistors remains constant. No potential change occurs across either resistor 41 or resistor 43 and no differential signal is applied to the input of the second stage 12. It may be seen, therefore, that the amplifier will amplify a differential signal applied to input terminals 28 and 29 but will not pass common mode signals.

As has been illustrated in the preferred embodiment the inverse feedback system is introduced only at the base of junction transistor 46 and that the centering voltage, that is, the voltage establishing the DC level of operation of the amplifier, is introduced at the base of junction transistor 49. This asymmetrical feedback control is possible because of the excellent common mode rejection of the input stage thus simplifying the circuit of the present preferred embodiment. Alternatively, inverse feedback could be introduced symmetrically into the base circuits of both transistors 46 and 49.

A second resistance 78 having a variable contact 79 is connected between source electrodes 47 and 51. The contact 79 is connected through resistor 80 to the point of reference potential or circuit ground. The purpose of impedance 78 and the ground connection is to permit balance of the input stage in the presence of imbalance between field effect transistors 37 and 38 as well as the other components of the input stage. The impedance of resistor 80 is high compared to the impedance of resistor 57 and the variable contact 79 is set so as to obtain no transmission of a common mode signal.

Resistors 62 and 56 connected in series with the base circuit of transistors 49 and 46 respectively, are for the purpose of stabilizing the operation of the amplifier in the DC mode. Temperature effects on a field effect transistor require a variation in the gate-to-source voltage as a function of temperature in order to maintain a constant drain current through the transistor. The required variation to maintain a particular constant drain current is not necessarily identical for various transistors. Likewise, because of temperature characteristics of junction transistors a variation in the emitter-to-base voltage as a function of temperature is required to maintain a constant collector current. Again, the required voltage between various transistors is not necessarily identical. In the junction transistor it is also required that the base current be varied as a function of temperature in order to maintain a constant collector current. The required change in base current as a function of temperature in order to maintain a constant collector current is a function of two factors. First, the base leakage current changes as a function of temperature although this effect may be minimized by use of silicon transistors. Second, the current amplification factor $\beta$ of both silicon and germanium transistors also varies with temperature. Generally speaking, the effect of this factor is to increase $\beta$ as a direct function of temperature. This results in a reduction in the base current as temperature increases.

As has been hereinbefore stated, resistors 62 and 56 are introduced in the base circuit of junction transistors 49 and 46 for the purpose of stabilizing the operation of the amplifier. Actually, both resistors 62 and 56 are not required and a resistor may be placed in one position or the other depending upon the particular characteristics of the components employed in the amplifier.

If there is any resistance in series with the base of either of the junction transistors then the change of base current due to temperature will produce a variation in voltage at the base thereof. By the introduction of either resistor 62 or resistor 56, or both, and adjustment to the proper values the effect may be proportioned to cancel all other source of drift hereinbefore referred to. This adjustment may readily be accomplished by first measuring the rate of change of the amplifier output voltage with one or both of these resistances inserted at a first temperature, then increasing the temperature of the amplifier and noting the offset voltage produced by this increased temperature. The rate of change in amplifier output is again measured at the increased temperature and from these parameters, that is, the rate of change of output at the first temperature, the rate of change in output at the second temperature and the change in offset voltage as the temperature increases from the first to the second temperature, the value of the resistance to be inserted for complete cancellation may be derived.

The amplifier as heretofore described, that is, when the switches are in the D position, operates as a direct coupled differential DC amplifier. The amplifier responds faithfully to signals of frequency ranging from direct current to a high frequency which may readily be made in excess of 30,000 c.p.s.

If it is desired to have the amplifier respond to alternating current signals with direct current signal suppressed the switches 17–26 are switched to the A position. In this condition all of the connections within the amplifier remain the same except in the feedback circuit 15. With switch 24 in the A position one end of potentiometer 76 is now connected through resistor 81 and capacitor 82 to the point of common potential or circuit ground and through switch 25 to gate electrode 83 of field effect transistor 84. Changing of switch 26 to the A position disconnects resistor 74 from resistor 75 and reconnects the resistor 74 in electrical series circuit with the source electrode 86. Drain electrode 87 is connected through drain resistor 88 to the point of common potential and resistor 89 is connected from the source of positive potential to the source electrode 86 in parallel with resistor 74.

These connections keep the negative feedback at its maximum value for direct current signals. The feedback path is now through variable resistor 76 to the gate of field effect transistor 84. Feedback voltage is taken from the source electrode 86 and applied to the base of junction transistor 46 as hereinbefore described. At higher alternating current frequencies the feedback voltage is attenuated by resistor 81 in series with capacitor 82. The low frequency time constant of the amplifier is essentially equal to the resistance of resistor 76 times the capacitance of capacitor 82 provided that the value of resistor 76 is large compared to the value of resistor 81. Capacitor 82 has a negligible impedance at higher alternating current frequencies; therefore, the feedback voltage is attenuated by the ratio of resistor 76, plus the source impedance, to resistor 81.

Field effect transistor 84 provides an impedance matching stage between the output and input stages of the amplifier, therefore the effect of base current of transistor 46 on the balance position of the amplifier is minimized. Since a junction transistor of the ordinary type has a base current of at least several microamperes this base current times the resistance of the feedback path would produce appreciable voltage drop therein and any change in this current with temperature would introduce a proportional unbalancing of the amplifier. By the introduction of the field effect transistor as an impedance matching stage there is a low impedance in the base circuit of transistor 46 and changes in the base current of this transistor now produce negligible effects on the balance of the amplifier. Since the field effect transistor 84 has extremely low gate current, only a minute voltage is developed in the feedback path. The impedance matching stage is not required when the amplifier is operated as a direct coupled DC amplifier, that is, when the switches are in the D position, since in this case the impedance in the base circuit of transistor 46 is, at a maximum, that of resistors 74 and 75 in parallel, plus the resistance 56, if employed. By proper arrangement of the component values as hereinbefore described, the amplifier may be balanced to make the effect on the amplifier caused by temperature negligible.

With the selector switches in the A position the low frequency response of the amplifier is determined by the time constant of resistor 76 and capacitor 82. Because of the impedance increase of capacitor 82 at lower frequencies the magnitude of the feedback signal is maintained relatively large thus effectively decreasing the gain of the amplifier. At higher frequencies the impedance to circuit ground through resistor 81 and capacitor 82 decreases thus decreasing the amount of feedback signal applied to gate 83 and the feedback signal is decreased at these higher frequencies. By proper arrangement of the various components, the amplifier may be made to substantially suppress DC components and those of lower frequency while providing the desired amplification of AC signals of high frequency. The amplifier while operating in the AC mode continues to provide common mode signal rejection as hereinbefore described.

To obtain essentially zero drift the amplifier may be operated as a differential input chopper amplifier by placing the selector switches 17–26 in the C position. In this position, the amplifier continues to operate in the AC mode as has previously been described except that choppers 90 and 91 are introduced at the input and output.

At the input of the amplifier a vibrating chopper switch 92 has its reed connected to the gate 35 of field effect transistor 37 through the coupling capacitor 93 which prevents any direct current component of the source from being applied directly to the gate electrode. As the reed of chopper switch 92 vibrates between its two contacts input terminals 28 and 29 are alternately connected through capacitor 93 to the gate electrode 35 at the vibrating frequency of the reed which may be made any desired value, typically 400 c.p.s. Capacitors 94 and 95 are respectively connected between the contacts and the reed of switch 92 and serve to provide an input from the source to the gate electrode during the very small instant of time when the reed is traveling from one contact to the other.

If only a DC potential exists between terminals 28 and 29 the connections thus far described are the only connections to the source required in order to obtain differential chopper amplification. In the presence of alternating current signals it is necessary to provide a signal representing the average potential between input terminals 28 and 29 to one side of the input differential stage. To accomplish this the present exemplary preferred embodiment illustrates a second pair of capacitors 97 and 98 connected in electrical series circuit between junctions 32 and 33 which are respectively connected through their attenuators to input terminals 28 and 29. Gate electrode 36 of field effect transistor 38 is connected to the junction of capacitors 97 and 98. Impedances 101 and 102 are serially connected between contacts C of switches 19 and 20. The junction of resistors 101 and 102 is connected to the junction of attenuators 30 and 31 and to circuit ground. The amplifier therefore responds to the alternating current signal at each input contact 28 and 29 during both halves of the chopper cycle. The functioning of the chopper circuit is more fully explained in U.S. Patent No. 2,931,985 dated Apr. 5, 1960.

The output of the amplifier is demodulated by operating chopper 91 synchronously with chopper 90. The output of the amplifier is coupled through selector switch 21 and blocking capacitor 103 to coupling transformer 104 which has one side of its secondary winding connected to the vibrating chopper switch 105 and the other side to the junction of capacitors 106 and 107 connected in electrical series circuit between the contacts of chopper switch 105. The contacts of chopper switch 105 are also connected to the C contacts of switches 22 and 23 which are directly connected, when the switches are in the C position, to output terminals 70 and 71. The operation of the demodulator circuit is more fully explained in U.S. Patent No. 3,079,565, dated Feb. 26, 1963.

It should be understood that choppers 90 and 91 may be of the mechanically operated vibrating reed type, as illustrated, or of any of a number of other well known electronic types of choppers of either the transistor, diode or tube type arranged such that chopper 91 operates synchronously with chopper 90.

Although the invention has been described in particularity in connection with the exemplary preferred embodiment illustrated in the drawing, it should be understood that other modifications and embodiments thereof will be apparent to those skilled in the art and that the preferred embodiment is given by way of illustration only and should not be considered a limitation upon the invention, the scope thereof being set forth in the appended claims.

What is claimed is:

1. A differential amplifier comprising first and second transistors, each having first, second and third electrodes, said first electrodes being current-amplifying terminals adapted to be connected to first and second current sources, said second electrodes being voltage-amplifying terminals connected to load circuits, and said third electrodes being control terminals adapted to receive input signals for controlling currents through said transistors to load circuits, a first input signal being applied between said first and third electrodes of said first transistor and a second input signal being applied between said first and third electrodes of said second transistor, whereby the amplified voltage difference between said first and second input signals is presented between said second electrodes of said first and second transistors, a first current control means connecting the first electrode of said first transistor to said first current source, a second current control means independent of said first current control means connecting the first electrode of said second transistor to said second current source, said second current control means having a control terminal adapted to receive a signal for control of current therethrough to said second transistor, a resistive means providing a current path connected from a junction between the first electrode of said first transistor and said first current control means to a junction between the first electrode of said second transistor and said second current control means to permit the currents through the second electrodes of said first and second transistors to change differentially in response to said first and second input signals and thereby maintain the sum of their currents substantially constant, and inverse feedback signal means connected between the second electrode of at least one of said first and second transistors and the control terminal of said second current control means.

2. A differential amplifier as defined in claim 1 wherein said first and second transistors are of the field-effect type in which the first, second and third electrodes are source, drain and control electrodes, respectively.

3. A differential amplifier as defined in claim 2 wherein said first and second current control means comprise junction transistors, each having its collector electrode connected to the first electrode of one of said first and second transistors, and its emitter connected to one of said current sources, the base electrode of the transistor of which said first current control means is comprised being connected to a control signal source, and the base electrode of the transistor of which said second current control means is comprised being connected to said inverse feedback means.

4. A differential amplifier as defined in claim 2 wherein said input signals to the third electrode of said first and second transistors are translated thereto by a modulator having a pair of input terminals, means for connecting opposite terminals of a signal source to said input terminals, two pair of capacitors, each pair being connected in series between said pair of input terminals, means for connecting a junction between one of said pair of capacitors to the control electrode of one of said transistors and a capacitor for connecting a junction between the other of said pair of capacitors to the control electrode of the other of said transistors, and switching means for alternately shunting the capacitors of the other of said pair of capacitors.

5. A differential amplifier as defined in claim 1 wherein said first and second current control means comprise junction transistors, each having its collector electrode connected to the first electrode of one of said first and second transistors, and its emitter connected to one of said current sources, the base electrode of the transistor of which said first current control means is comprised being connected to a control signal source, and the base electrode of the transistor of which said second current control means is comprised being connected to said inverse feed-back means.

6. A differential amplifier as defined in claim 5 including means connected to a control terminal of said first current control means for adjusting current therethrough under quiescent operating conditions.

7. A differential amplifier as defined in claim 1 in which said resistive means comprises a three-terminal potentiometer having its sliding contact terminal connected to a source of bias potential and its remaining two terminals being connected to the first electrodes of said first and second transistors.

8. A differential amplifier as defined in claim 1 wherein said feedback signal means comprises a field effect transistor in the feedback signal means connected to the control terminal of said second current control means.

9. A differential amplifier as defined in claim 1 wherein said input signals to the third electrodes of said first and second transistors are translated thereto by a modulator and said load circuits comprise a demodulator.

10. A differential amplifier comprising first and second transistors, each having first, second and third electrodes, said first electrodes being current amplifying terminals adapted to be connected to first and second current sources, said second electrodes being voltage amplifying terminals connected to load circuits, and said third electrodes being control terminals adapted to receive input signals for controlling currents through said transistors to load circuits, a first input signal being applied between said first and third electrodes of said first transistor and a second input signal being applied between said first and third electrodes of said second transistor, whereby the amplified voltage difference between said first and second input signals is presented between said second electrodes of said first and second transistors, a first current control means connecting the first electrode of said first transistor to said first current source, a second current control means independent of said first current control means connecting the first electrode of said second transistor to said second current source, a resistive means providing a current path connected from a junction between the first electrode of said first transistor and said first current control means to a junction between the first electrode of said second transistor and said second current control means to permit the currents through the second electrodes of said first and second transistors to change differentially in response to said first and second input signals and thereby maintain the sum of their currents substantially constant.

11. A differential amplifier as defined in claim 10 wherein said first and second transistors are of the field-effect type in which the first, second and third electrodes are source, drain and control electrodes, respectively.

12. A differential amplifier as defined in claim 11 wherein said first and second current control means comprise junction transistors, each having its collector electrode connected to the first electrode of one of said first and second transistors, and its emitter connected to one of said current sources, the base electrode of the transistor of which said first current control means is comprised being connected to a control signal source.

13. A differential amplifier as defined in claim 10 wherein said first and second current control means comprise junction transistors, each having its collector electrode connected to the first electrode of one of said first and second transistors, and its emitter connected to one of said current sources, the base electrode of the transistor of which said first current control means is comprised being connected to a control signal source.

References Cited

UNITED STATES PATENTS

| | | | |
|---|---|---|---|
| 2,638,493 | 5/1953 | Trischka et al. | 330—69 X |
| 2,936,345 | 5/1960 | Kinkel. | |
| 3,018,446 | 1/1962 | Knudson | 330—24 X |
| 3,024,422 | 3/1962 | Jansson | 330—18 |
| 3,131,312 | 4/1964 | Putzrath. | |
| 3,178,647 | 4/1965 | Harnett | 330—69 X |

ROY LAKE, *Primary Examiner.*

NATHAN KAUFMAN, *Examiner.*